(12) United States Patent
Regau et al.

(10) Patent No.: US 10,237,947 B2
(45) Date of Patent: Mar. 19, 2019

(54) ASSEMBLY FOR OPERATING AN ORGANIC RADIATION-EMITTING COMPONENT

(71) Applicant: OSRAM OLED GmbH, Regensburg (DE)

(72) Inventors: Kilian Regau, Regensburg (DE); Stefan Gierisch, Windischeschenbach (DE)

(73) Assignee: OSRAM OLED GMBH, Regensburg (DE)

( * ) Notice: Subject to any disclaimer, the term of this patent is extended or adjusted under 35 U.S.C. 154(b) by 0 days.

(21) Appl. No.: 15/738,496

(22) PCT Filed: Jun. 22, 2016

(86) PCT No.: PCT/EP2016/064447
§ 371 (c)(1),
(2) Date: Dec. 20, 2017

(87) PCT Pub. No.: WO2016/207232
PCT Pub. Date: Dec. 29, 2016

(65) Prior Publication Data
US 2018/0177018 A1   Jun. 21, 2018

(30) Foreign Application Priority Data
Jun. 23, 2015  (DE) .................. 10 2015 110 075

(51) Int. Cl.
*H01L 27/32*  (2006.01)
*H03K 17/96*  (2006.01)
(Continued)

(52) U.S. Cl.
CPC ..... *H05B 33/0896* (2013.01); *H01L 27/3202* (2013.01); *H01L 27/323* (2013.01);
(Continued)

(58) Field of Classification Search
CPC ............ H05B 33/0896; H05B 37/0227; H03K 17/962; H03K 17/9631; H03K 17/9627;
(Continued)

(56) References Cited

U.S. PATENT DOCUMENTS

| 4,794,208 A | 12/1988 | Watson |
| 2007/0068786 A1* | 3/2007 | Hein ................... G06F 3/044 |
| | | 200/510 |

(Continued)

FOREIGN PATENT DOCUMENTS

| CN | 201628940 U | 11/2010 |
| CN | 203178981 U | 9/2013 |

(Continued)

OTHER PUBLICATIONS

Fraunhofer—COMEDD http://www.comedd.fraunhofer.de/content/dam/comedd/common/products/COMEDD/touch-pled-d.pdf; Print Date Dec. 20, 2017.

*Primary Examiner* — Alexander H Taningco
*Assistant Examiner* — Renan Luque
(74) *Attorney, Agent, or Firm* — McDermott Will & Emery LLP

(57) ABSTRACT

An arrangement for operating an organic radiation-emitting component (D) is specified. The arrangement comprises a driver circuit (T) with at least two driver outputs (TA1, TAn), a decoupling unit (E) with at least two inputs (EE1, EEn) and outputs (EA1, EAn) corresponding to the inputs (EE1, EEn), the radiation-emitting component (D) with at least two electrodes (DE1, DEn), and a contact sensor (S) with a sensor electrode (SE1) which is at least partially formed by one of the electrodes (DE1, DEn) of the radiation-emitting component (D). The radiation-emitting component (D) emits electromagnetic radiation during operation. One of the driver outputs (TA1, TAn) of the driver circuit (T) is coupled in each case, in a low-impedance manner using DC (Continued)

Figure 1:
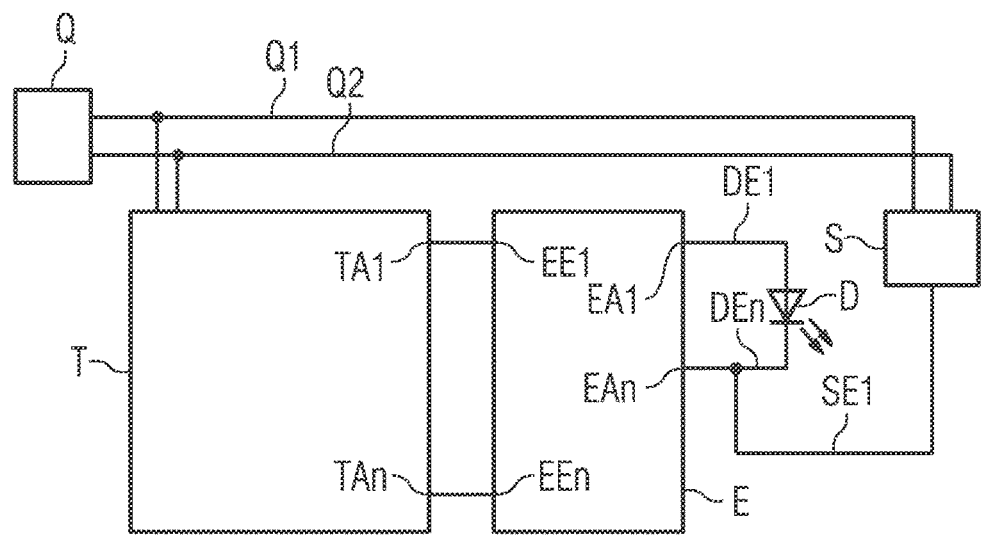

technology, to one of the electrodes (DE1, DEn) of the radiation-emitting component (D). The driver circuit (T) and the contact sensor (S) can be coupled to a common energy source (Q). The contact sensor (S) is decoupled from the driver circuit (T) by means of the decoupling unit (E) in such a manner that contact of the sensor electrode (S) by a user can be detected during operation of the radiation-emitting component (D).

13 Claims, 6 Drawing Sheets

(51) Int. Cl.
*H05B 33/08* (2006.01)
*H05B 37/02* (2006.01)
*H01L 27/02* (2006.01)

(52) U.S. Cl.
CPC ....... *H01L 27/3204* (2013.01); *H03K 17/962* (2013.01); *H03K 17/9627* (2013.01); *H03K 17/9631* (2013.01); *H05B 37/0227* (2013.01); *H01L 27/0288* (2013.01); *H03K 2217/960795* (2013.01)

(58) Field of Classification Search
CPC ...... H03K 2217/960795; H03K 2217/960785; H01L 27/3204; H01L 27/3202; H01L 27/323; H01L 27/0288; H01L 2227/323; H01L 2251/5338; H01L 2251/5361; H01L 27/3206; H01L 27/3225; H01L 27/3262; H01L 51/0013; H01L 51/0023; H01L 51/0096; H01L 51/50; H01L 51/5012; H01L 51/5056; H01L 51/5072; H01L 51/5088; H01L 51/5206; H01L 51/5221; H01L 51/5246; H01L 51/5253; H01L 51/529; H01L 51/56; G06F 1/00; G06F 1/1626; G06F 2203/04103; G06F 3/016; G06F 3/0202; G06F 3/023; G06F 3/0238; G06F 3/041; G06F 3/0412; G06F 3/0416; G06F 3/044; G06F 3/0482; G06F 3/04886; G09B 21/004; G09G 2300/0452; G09G 2300/0809; G09G 2300/0833; G09G 2310/0262; G09G 2310/027; G09G 2310/0286; G09G 2320/045; G09G 2360/12; G09G 3/2014; G09G 3/2022; G09G 3/2081; G09G 3/3208; G09G 3/3225; G09G 3/3233
See application file for complete search history.

(56) References Cited

U.S. PATENT DOCUMENTS

| | | | |
|---|---|---|---|
| 2008/0265788 A1 | 10/2008 | Yamauchi et al. | |
| 2010/0295604 A1 | 11/2010 | Hente | |
| 2010/0321305 A1 | 12/2010 | Chang et al. | |
| 2013/0043803 A1* | 2/2013 | Raj | H05B 33/0896 315/241 R |
| 2013/0155630 A1* | 6/2013 | Yilmaz | G06F 3/044 361/748 |
| 2013/0181946 A1* | 7/2013 | Lee | G06F 3/044 345/174 |
| 2015/0091855 A1* | 4/2015 | Chen | G06F 3/0412 345/174 |
| 2016/0018940 A1* | 1/2016 | Lo | G06F 3/0416 345/174 |
| 2016/0363304 A1* | 12/2016 | Omata | G06F 3/044 |
| 2017/0123541 A1* | 5/2017 | Omata | G09G 3/3208 |

FOREIGN PATENT DOCUMENTS

| | | |
|---|---|---|
| CN | 102405457 B | 8/2014 |
| DE | 10308514 A1 | 9/2004 |
| DE | 102006044478 A1 | 3/2007 |
| DE | 602004009408 T2 | 7/2008 |
| EP | 1589407 A1 | 10/2005 |
| WO | 2009095848 A2 | 8/2009 |
| WO | 2012113833 A1 | 8/2012 |

* cited by examiner

ASSEMBLY FOR OPERATING AN ORGANIC RADIATION-EMITTING COMPONENT

An assembly for operating an organic radiation-emitting component is specified.

This patent application claims the priority of the German Patent Application DE 10 2015 110 075.4, the disclosure of which is incorporated herein by reference.

One object is to provide an assembly that contributes to a reliable operation of a radiation-emitting component and allows a simple and cost-effective production of the component. Furthermore, it is an object to provide an assembly which allows to detect a touch of the radiation-emitting component during operation of the radiation-emitting component.

An assembly for operating an optoelectronic radiation-emitting component is provided, including the radiation-emitting component. In particular, the radiation-emitting component can be an organic light-emitting diode (OLED).

In at least one embodiment, the radiation-emitting component comprises at least two electrodes. The electrodes can be an anode and a cathode of an organic light-emitting diode. The electrodes particularly serve to supply current to the radiation-emitting component.

In at least one embodiment, the assembly includes a driver circuit. The driver circuit comprises at least two driver outputs. The driver circuit can be any driver or a current regulator. The driver outputs particularly serve to supply current to electric components connected downstream. In view of an electric circuit connected downstream, at least one of the outputs can be flown-through by current in a first direction with respect to the driver circuit, as well as at least one of the outputs can be flown-through by current in a direction opposite the first direction with respect to the driver circuit, so that the electric circuit is closed.

In at least one embodiment, the assembly includes a decoupling unit. The decoupling unit comprises at least two inputs and outputs corresponding to the inputs. The inputs and outputs are in each case coupled to one another in such a way that a DC portion of a current flowing between the respective input and output is essentially not attenuated. The inputs and outputs of the decoupling unit are not necessarily arranged in one single unit, but can rather be arranged in a distributed manner with respect to the radiation-emitting component.

In at least one embodiment, the assembly includes a touch sensor. The touch sensor comprises a sensor electrode which is at least partially formed by one of the electrodes of the radiation-emitting component. In particular, the touch sensor is configured to detect a touch by a user. In particular, in this context, the touch sensor is configured to provide a high-frequency signal via the sensor electrode for touch detection. The touch sensor can e.g. include a high-frequency source as well as an evaluation circuit. For example, detection of the high-frequency signal for touch detection can be effected by measuring the impedance between the sensor electrode and a voltage supply input of the touch sensor, e.g. in accordance with the principle of a charge pump. In particular, the touch sensor is a capacitive touch sensor.

In particular, the electrode of the radiation-emitting component is a surface perceived by the user to be radiating or to be penetrated by radiation during operation of the radiation-emitting component. In this context, the electrode is of transparent design, for example. In particular, to that end, the respective electrode can comprise a transparent conductive oxide (TCO). Transparent conductive oxides are transparent, conducting materials, usually metal oxides such as e.g. zinc oxide, tin oxide, cadmium oxide, titanium oxide, indium oxide or indium tin oxide (ITO). The sensor electrode is completely formed by the electrode of the radiation-emitting component, for example.

In deviation thereof, the electrode of the radiation-emitting component forming the sensor electrode can be a further electrode located opposite an electrode of transparent design which is penetrated by radiation. In particular, this electrode can be spaced from an actually touched surface, e.g. the transparent electrode.

In at least one embodiment, the radiation-emitting component emits electromagnetic radiation during operation. In particular, the radiation-emitting component can generate white and/or colored light during operation. The radiation-emitting component can for example comprise multiple segments, so that the user can perceive various shapes and/or colors of the radiation-emitting component. In this case, a number of the segments is between 1 and 100, in particular between 1 and 20. In particular, the number of segments is between 1 and 10.

In at least one embodiment, the driver circuit is coupled to in each case one of the electrodes of the radiation-emitting component with in each case one of the driver outputs. Here, in particular, the in each case one driver output is coupled to the in each case one electrode in a DC-wise low impedance manner. Thus, a DC portion of a current supply of the radiation-emitting component is essentially not attenuated. In particular, this serves to supply current to the radiation-emitting component with as little loss as possible, so that the radiation-emitting operation thereof is made possible.

In at least one embodiment, the driver circuit and the touch sensor are coupleable to a common energy source. In particular, the driver circuit, separately from the driver outputs, as well as the touch sensor, separately from the sensor electrode, can be coupled to the energy source.

In at least one embodiment, the touch sensor is decoupled from the driver circuit by means of the decoupling unit. In particular, the touch sensor is decoupled from the driver circuit in such a way that a touch of the sensor electrode by a user can be detected during the radiation-emitting operation of the radiation-emitting component. In other words, the touch can be detected in particular independently from the operation of the radiation-emitting component.

Advantageously, an interruption of the DC-wise coupling of the driver circuit to the radiation-emitting component for touch detection is merely optional. The touch sensor is coupled to one of the electrodes of the radiation-emitting component in an AC-wise low impedance manner, for example, such that a touch of the radiation-emitting component by the user can be detected. An alternating current between the touch sensor and the respective electrode of the radiation-emitting component, in particular a high-frequency AC portion, receives a comparatively low attenuation for the operation of the touch sensor. The decoupling unit is for example arranged such that without the radiation-emitting component being touched by the user, an alternating current path between the driver circuit, the touch sensor and the radiation-emitting component is interrupted, i.e. an AC portion between the driver circuit, the touch sensor and the radiation-emitting component is significantly attenuated.

In at least one embodiment, the assembly for operating an organic light-emitting component includes a driver circuit with at least two driver outputs, a decoupling unit with at least two inputs and outputs corresponding to the inputs, the radiation-emitting component with at least two electrodes as well as a touch sensor having a sensor electrode, which is at least partially formed by one of the electrodes of the radiation-emitting component.

The radiation-emitting component emits electromagnetic radiation during operation. The driver circuit is coupled to in each case one of the electrodes of the radiation-emitting component with in each case one of the driver outputs in a DC-wise low-impedance manner. The driver circuit, separately from the driver outputs, and the touch sensor, separately from the sensor electrode, is coupleable coupled to a common energy source. The touch sensor is decoupled from the driver circuit by means of the decoupling unit in such a way that a touch of the sensor electrode by a user is detectable during the operation of the radiation-emitting component.

Advantageously, an organic radiation-emitting component, e.g. a segmented or non-segmented OLED, can be operated by means of the assembly, wherein an electrode of the OLED can at the same time be used for touch detection. Here, touch detection is essentially independent of the operation of the OLED. In particular, no synchronization is required between a driver for driving the OLED as well as the touch sensor, contributing to a simple and cost-effective production of the assembly. Furthermore, a control unit for periodically interrupting the radiation-emitting operation of the OLED can be dispensed with. Thus, the OLED can be operated in a continuous operating mode, in contrast to an above-mentioned pulsed operation. This contributes to achieving a nominal brightness of the OLED at a comparatively low current level, so that it is contributed to a long-life cycle of the OLED. Furthermore, flickering of the OLED can be prevented.

Furthermore, by the omission of the control unit, requirements for the driver circuit used for operating the radiation-emitting component can be kept low. Furthermore, application of a separate, conductive transparent foil for touch detection as well the optical coupling and contacting thereof can be dispensed with. Specifically, Newton's rings produced by the optical output coupling can be prevented and/or spring contacts for contacting can be dispensed with. In this context, it is contributed to a particularly efficient operation of the radiation-emitting component as well as to the cost-effective production thereof.

In at least one embodiment, at least one input of the decoupling unit is inductively decoupled AC-wise from the corresponding output of the decoupling unit. In other words, an AC portion between the respective input and output is significantly attenuated. To that end, the decoupling unit comprises a coil, for example, which connects the respective input with the corresponding output of the decoupling unit in an AC-wise decoupling manner.

This comes with the advantage that a robust and cost-effective production of the decoupling unit is supported. In particular, a DC-wise coupling of the respective input and output is still made possible.

In at least one embodiment, in each case at least two inputs and outputs of the decoupling unit are inductively coupled to one another by means of a coil and arranged in such a way that a flow of current runs in opposite directions through the respective coils during operation of the light-emitting component. Here, these coils form a so called "common mode choke". The inputs and outputs of the decoupling unit are advantageously configured such that an attenuation of a flow of current for operating the radiation-emitting component is kept low, even if this current contains an AC portion (e.g. pulsing/PWM).

In at least one embodiment, the inputs of the decoupling unit are in each case coupled to the driver outputs of the driver circuit. Furthermore, the outputs of the decoupling unit are in each case coupled to the electrodes of the radiation-emitting component. A current flow for operating the radiation-emitting component thus runs from the driver circuit to the radiation-emitting component via the decoupling unit.

This allows attenuating an AC portion between the driver circuit and the radiation-emitting component to such an extent that the touch sensor is essentially decoupled AC-wise from the driver circuit.

In at least one embodiment, the inputs of the decoupling unit are in each case coupleable to poles of the energy source. Furthermore, the outputs of the decoupling unit are in each case coupled to the touch sensor. In particular, the outputs of the decoupling unit are in each case coupled to the touch sensor separately from the sensor electrode.

This allows attenuating an AC portion of an electric circuit between the driver circuit, the energy source and the touch sensor to such an extent, that the touch sensor is essentially decoupled AC-wise from the driver circuit. A current flow for operating the radiation-emitting component can flow from the driver circuit directly to the radiation-emitting component, for example. As an alternative, the driver circuit and the radiation-emitting component can be coupled to one another via a further decoupling unit.

In at least one embodiment, the inputs of the decoupling unit are in each case coupleable to poles of the energy source. Furthermore, the outputs of the decoupling unit are in each case coupled to the driver circuit. In particular, the outputs of the decoupling unit are in each case coupled to the driver circuit separately from the driver outputs.

This allows attenuating an AC portion of an electric circuit between the driver circuit, the energy source and the touch sensor to such an extent, that the touch sensor is essentially decoupled AC-wise from the driver circuit. A current flow for operating the radiation-emitting component can flow e.g. from the driver circuit directly to the radiation-emitting component here. As an alternative, the driver circuit and the radiation-emitting component can also be coupled to one another via a further decoupling unit. As an alternative or in addition, the energy source and the touch sensor can also be coupled to one another via a further decoupling unit.

In at least one embodiment, the touch sensor is decoupled DC-wise from the respective electrode of the radiation-emitting component. In this context, the touch sensor has a capacitor assigned to it, for example, which capacitively couples the touch sensor to the respective electrode of the radiation-emitting component. In particular, this allows an AC-wise substantially attenuation-free coupling of the touch sensor with the respective electrode of the radiation-emitting component, i.e. a coupling with a comparatively low attenuation in view of an AC portion, such that the touch by a user can be reliably detected. The decoupling DC-wise of the touch sensor from the respective electrode contributes to the fact that current peaks at the touch sensor can be prevented. This particularly allows long-term operation of the touch sensor. In particular, it is possible here to contribute to a robustness of the touch sensor against DC portions of the driver circuit and/or of the radiation-emitting component. It is e.g. prevented that these can flow into the touch sensor via the sensor electrode or that a foreign DC voltage is applied to the touch sensor, such that interference or destruction of the touch sensor is prevented.

In at least one embodiment, the driver circuit is configured as a switching regulator. Advantageously, this contributes to a simple and cost-effective manufacture of the assembly. In particular, this allows a particularly efficient operation of the radiation-emitting component.

In at least one embodiment, the driver circuit is configured as a linear regulator. Advantageously, this contributes to a high electromagnetic compatibility of the assembly. In particular, chokes for eliminating EMC interference of the driver circuit can be dispensed with.

In at least one embodiment, the radiation-emitting component includes at least one organic light-emitting diode. The at least one organic light-emitting diode is a segmented organic light-emitting diode, for example. The segmented organic light-emitting diode can comprise multiple segments operable separately from one another in a radiation-emitting manner, which can be different from one another in terms of their color or shape perceivable by a user. In this context, the individual segments can in each case have assigned to them at least one common electrode as well as in each case one electrode that can be controlled separately. These electrodes form the electrodes of the radiation-emitting component, for example.

Alternatively or in addition, the radiation-emitting component can comprise a plurality of organic light-emitting diode that can be operated independently from one another. In this context, the individual organic light-emitting diodes can for example each have electrodes for operating the respective organic light-emitting diode assigned to it. These electrodes can at least partially form the electrodes of the radiation-emitting component.

In this case, the touch sensor can have multiple sensor electrodes assigned to it, with individually-controllable electrodes at least partially forming a sensor electrode of the touch sensor. A touch of a respective segment or of the assigned light-emitting diode can thereby be detected and can be assigned to the respective segment or the assigned light-emitting diode.

In at least one embodiment of the invention, the radiation-emitting component includes a plurality of organic light-emitting diodes. The light-emitting diode are coupled DC-wise in a series connection. Respective successive organic light-emitting diodes are decoupled AC-wise from one another.

This advantageously allows to detect a touch of the respective light-emitting diode. To that end, the successive light-emitting diodes are coupled by means of coils arranged between the successive light-emitting diodes. Dimensions of parameters of these coils can be different from those of the coils assigned to the decoupling unit. Depending on the dimension, an attenuation factor of an AC portion of a current flow can be adjusted by the respective coil. The AC-wise decoupling of the in each case successive organic light-emitting diodes can be a decoupling that is sufficient for the reliable operation of the touch sensor. In other words, the AC portion of the current flow through the respective coils is attenuated to such an extent that the touch sensor can perform a detection of the touch. However, an attenuated AC portion is present even after a flow through a respective coil. Advantageously, a respective touch of multiple organic light-emitting diodes can be detected by means of merely one sensor electrode. The respective touch can be particularly assignable to the respective organic light-emitting diode depending on the attenuation, i.e. depending on an amplitude measured by means of the touch sensor or on a transported amount of charge of the AC portion.

In at least one embodiment of the invention, at least one electrode, which is assigned to the first organic light-emitting diode with respect to the series connection, or at least one electrode, which is assigned to the last organic light-emitting electrode with respect to the series connection, is coupled with the sensor electrode of the touch sensor. In particular, the sensor electrode is at least partially formed by one of these electrodes. Advantageously, this allows the detection of a respective touch of all organic light-emitting diodes connected in series. In particular, the respective touch can be assignable to the respective organic light-emitting diode depending on the attenuation, for example.

In at least one embodiment, the radiation-emitting component comprises a plurality of organic light-emitting diodes coupled DC-wise via a common electrode. The radiation-emitting component is a multi-segment OLED, for example. For example, an in each case individually operable electrode is assigned to the organic light-emitting diodes coupled DC-wise to one another via the common electrode.

In at least one embodiment, the organic light-emitting diodes are decoupled AC-wise from one another. Advantageously, an AC portion between the organic light-emitting diodes coupled DC-wise to one another via the common electrode receives an attenuation to such an extent that a detection of a touch of the respective organic light-emitting diode is allowed separately from one another. In this context, the touch sensor can have a plurality of sensor electrodes assigned to it.

For example, the common electrode includes coils to that end, which in each case couple DC-wise two organic light-emitting diodes to one another.

In at least one embodiment, the touch sensor comprises a plurality of sensor electrodes, which is at least in part formed by one of the electrodes assigned to the respective organic light-emitting diode. A touch of the respective electrode of the radiation-mitting component by the user is detectable and assignable to the respective organic light-emitting diode.

Further features, configurations and expediences result from the following description of the exemplary embodiments in conjunction with the Figures.

Figure 2:
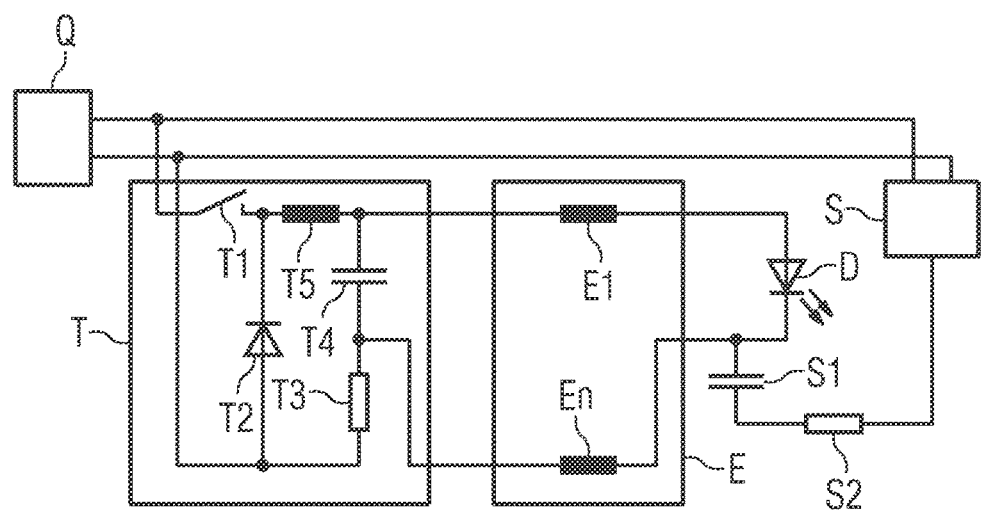
Figure 3:
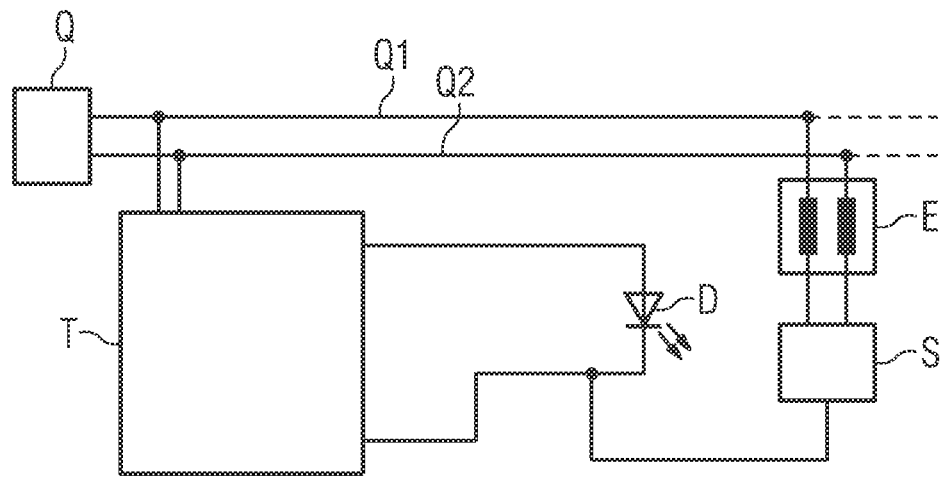
Figure 4:
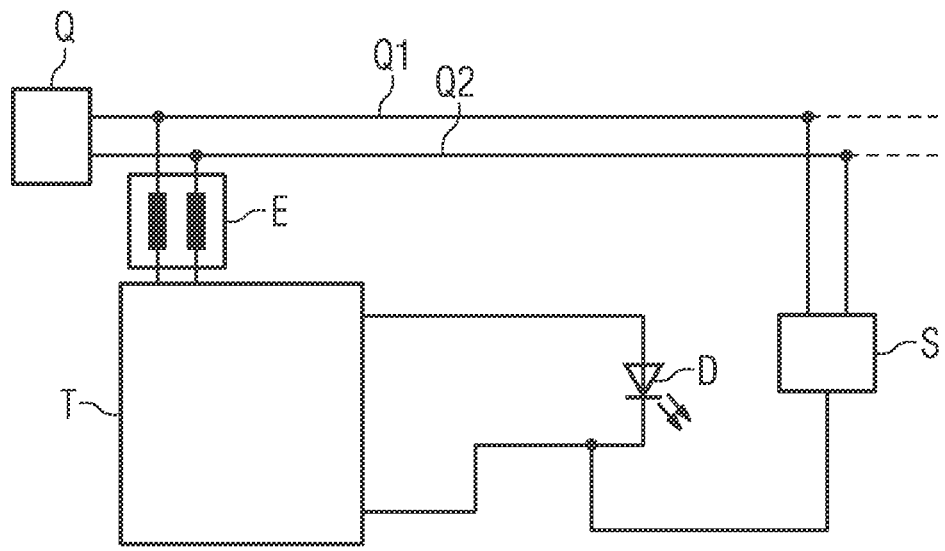
Figure 5:
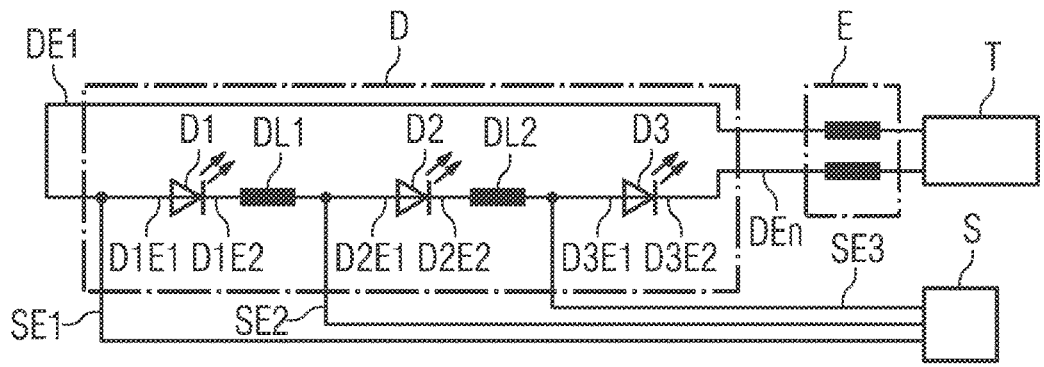
Figure 6:
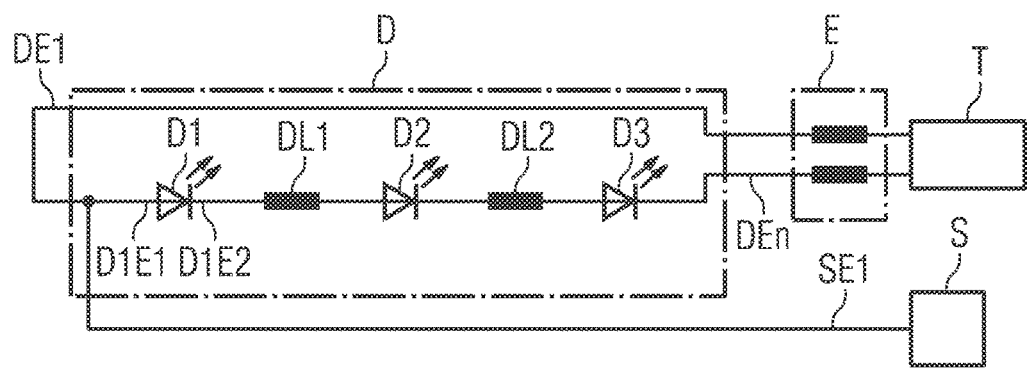
Figure 7:
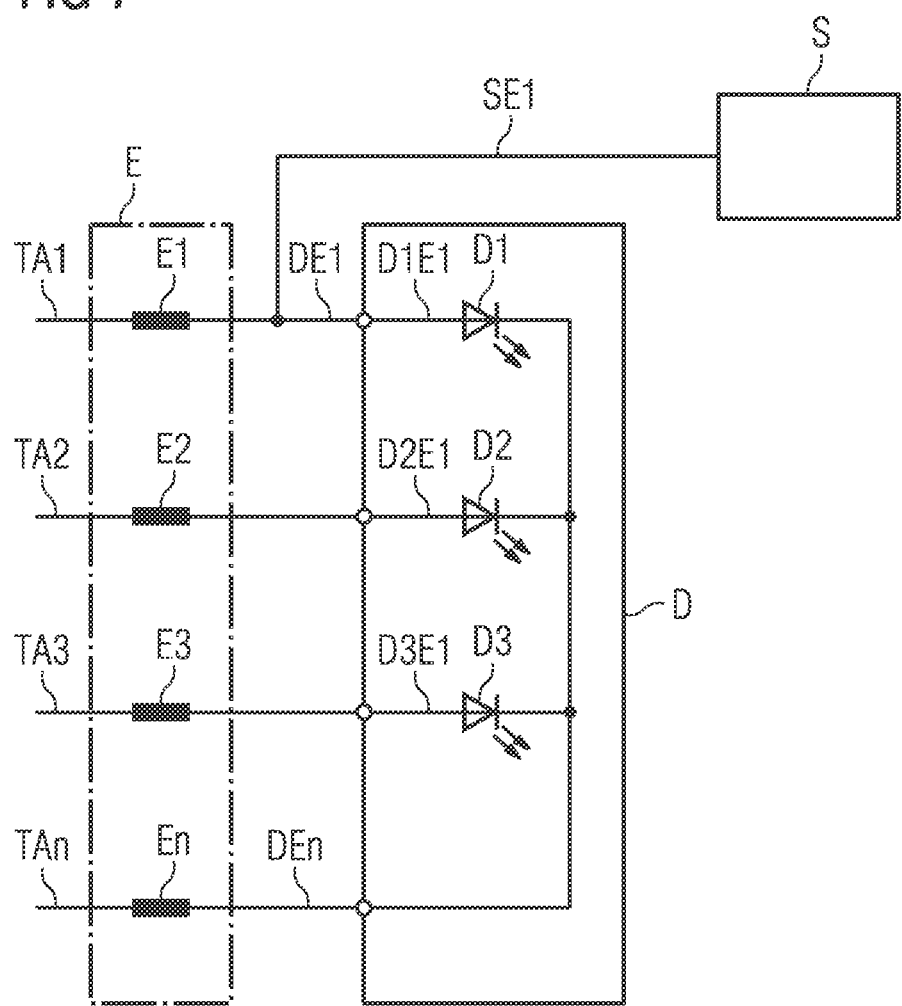
Figure 8:
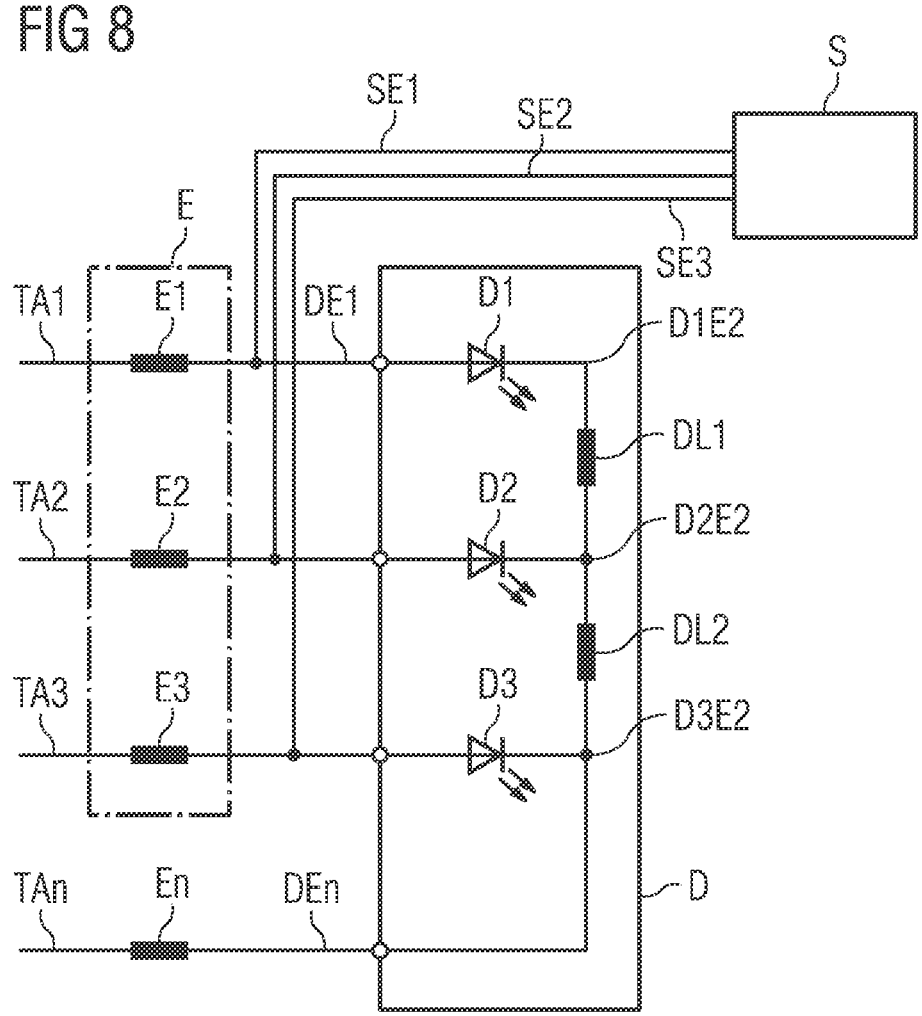
Figure 9:
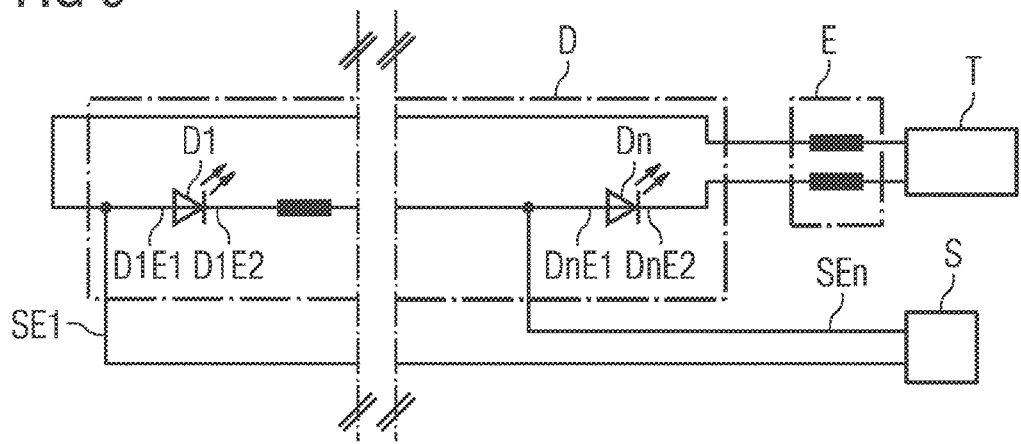

The figures show in:

FIG. 1 a first exemplary embodiment of an assembly for operating a radiation-emitting component;

FIG. 2 a second exemplary embodiment of the assembly according to FIG. 1, FIG. 3 a third exemplary embodiment of an assembly for operating the radiation-emitting component, FIG. 4 a fourth exemplary embodiment of an assembly for operating the radiation-emitting component, FIG. 5 a fifth exemplary embodiment of an assembly for operating of the radiation-emitting component, FIG. 6 a sixth exemplary embodiment of an assembly for operating the radiation-emitting component, FIG. 7 a seventh exemplary embodiment of an assembly for operating the radiation-emitting component, FIG. 8 an eighth exemplary embodiment of an assembly for operating the radiation-emitting component, and FIG. 9 a ninth exemplary embodiment of an assembly for operating the radiation-emitting component.

Like, similar and equivalent elements are denoted with the same reference characters throughout the figures. The figures and the size ratios of the elements illustrated in the figures are not to be considered as true to scale. Rather, individual elements can be illustrated in an exaggerated size for the purpose of a better understanding.

A first exemplary embodiment of an assembly for operating a radiation-emitting component D is illustrated schematically in FIG. 1.

The assembly includes a driver circuit T, a decoupling unit E, the radiation-emitting component D as well as a touch sensor S. The assembly has an energy source Q assigned to it, wherein the driver circuit T as well as the touch sensor S is formed to be coupleable therewith.

In a first variant, the energy source Q is a mains supply. In this context, the driver circuit T and/or the touch sensor S can have a power supply unit not explained in further detail here connected upstream, for example. In a further variant, the energy source Q is an energy storage, in particular an electric energy storage such as a battery, for example. Also conceivable are other energy storages such as a capacitor, for example.

In this exemplary embodiment, the driver circuit T as well as the touch sensor S are designed to be coupleable to the energy source Q and, in particular, can be decoupled therefrom. To that end, the assembly forms a physical unit which can be disconnected from the energy source Q. In other exemplary embodiments, the assembly can also include the energy source Q. In particular, the assembly can form a physical unit with the energy source Q.

The driver circuit T includes a first driver output TA1 and at least one further driver output TAn. The decoupling unit E includes a first input EE1 as well as a first output EA1 corresponding thereto. Furthermore, the decoupling unit E includes at least one further input EEn as well as a further output EAn corresponding thereto. The radiation-emitting component D includes a first electrode DE1 as well as at least one further electrode DEn.

In this exemplary embodiment, the driver outputs TA1, TAn are coupled with the inputs EE1, EEn of the decoupling unit E as well as via the outputs EA1, EAn with the electrodes DE1, DEn of the radiation-emitting component D. One of the electrodes DE1, DEn forms a sensor electrode SE1 of the touch sensor S, such that touching of this electrode DE1, DEn by a user can be detected by the touch sensor S. To that end, the touch sensor S is designed to provide a high-frequency signal via the sensor electrode SE1. In other words, the touch sensor S can include a high-frequency source. Furthermore, the touch sensor S is configured to detect a high-frequency signal, in particular. In this context, the touch sensor S can include a detection circuit, wherein the detection circuit and the high-frequency source form a physical unit, for example. In particular, the detection circuit is configured to detect whether the sensor electrode SE1 has been touched or not.

In particular, the touch sensor S is a capacitive touch sensor, in which e.g. a high-frequency transfer behavior of capacitors of the touch sensor S is influenced by approach of the user. Detection preferably takes place by means of a kind of simple high-frequency impedance measuring between the sensor electrode SE1 and a voltage supply input of the touch sensor S, e.g. according to the principle of a charge pump. In this context, touching of the electrodes DE1, DEn also includes a user approaching the electrodes DE1, DEn, e.g. if merely a glass cover of the radiation-emitting component D is touched. In this exemplary embodiment, the sensor electrode SE1 is formed by the further electrode DEn of the radiation-emitting component D. In other exemplary embodiments, the sensor electrode SE1 is formed by the first electrode DE1, for example.

In this exemplary embodiment, the energy source Q includes two poles Q1, Q2. The number of poles Q1, Q2 can vary depending on the requirements here. The driver circuit T as well as the touch sensor S are coupled with the poles Q1, Q2 of the energy source Q in each case separately from the driver outputs TA1, TAn or from the sensor electrode SE1, respectively.

The driver circuit T is configured to provide a current for operating the radiation-emitting component D on its driver outputs TA1, TAn. By means of the assembly, a closed electric circuit is formed, such that a flow of current is enabled from the first driver output TA1 to the further driver output TAn, for example. In particular, the driver circuit T provides a direct current.

The decoupling unit E is configured to decouple AC-wise the driver circuit T from the touch sensor S, such that the touch by a user is also possible during a radiation-emitting operation of the radiation-emitting component D. The transfer behavior of the touch sensor S is essentially not affected thereby, for example. Here, a turn-on, turn-off or dimming function of the radiation-emitting component D can be implemented, which is controlled by the touch. In particular, a detection signal of the touch sensor S can also be provided as a sensor signal or control signal e.g. of a control device or of a controllable electric component externally with respect to the assembly. Here, the assembly can serve as a radiation-emitting component, for example. The decoupling unit E can additionally be used to eliminate EMC interference.

In particular, the radiation-emitting component D includes an organic light-emitting diode or is configured as such a diode. Advantageously, the organic light-emitting diode is of large area compared to other light sources, in particular LEDs, and therefore comes with a large operating surface for a touch sensor.

A second exemplary embodiment of the assembly according to FIG. 1 is schematically illustrated in FIG. 2. The driver circuit T is e.g. configured as a so-called buck converter or as a current regulator. The driver circuit T includes, as an example, a high-frequency clocked switch T1, a diode T2, a shunt resistor T3, a capacitor T4 as well as a coil T5.

The decoupling unit E includes two decoupling elements E1, En for attenuating an AC portion between the respective inputs and outputs EE1, EA1 and EEN, EAn (see FIG. 1). The decoupling elements E1, En are e.g. coils, which are formed individually or preferably, as common mode chokes, so that a particularly high efficiency and interference resistance of the assembly is supported. The coils do not separate DC-wise the radiation-emitting component D from the driver circuit T such that it is operable both pulsed and continuously with direct current. In particular, the coils do not separate the radiation-emitting component D from the driver circuit T in an operating-current fashion. Here, the coils sufficiently separate an AC-voltage detector signal of the touch sensor S from the driver circuit T. Advantageously, merely cost-effective passive components are used to that end. In particular, control by means of active components and switching between illumination phase and touch detection can be dispensed with. Furthermore, this allows the operation of the radiation-emitting component D with an advantageously low operating current, which contributes to a long life of the radiation-emitting component D.

In contrast to the first exemplary embodiment, a capacitor S1 is interconnected between the touch sensor S and the radiation-emitting component D. This capacitor allows decoupling DC-wise the radiation-emitting component D from the touch sensor S, such that protection of the touch sensor S is made possible. In particular, this capacitor S1 is low resistive for alternating current, but highly resistive for direct current.

The decoupling unit E, however, is highly resistive only for alternating current, but low resistive for direct current. In this way, AC detector signals of the touch sensor S arrive at the electrodes DE1, DEn of the radiation-emitting component D, but are not forwarded in the direction of the driver circuit T due to the decoupling unit E. In contrast, the direct current provided by the driver circuit T can flow to the radiation-emitting component D for the operation thereof, wherein, however, no direct current can drain via the capacitor S1 and interfere with the touch sensor S or completely destroy it.

As an alternative or in addition, in contrast to the first exemplary embodiment, the touch sensor S and the radiation-emitting component D have a resistor S2 interconnected in series. An order of an assembly of the capacitor S1 as well as of the resistor S2 is variable here. The resistor S2 can contribute to a particularly precise detection of a touch of the sensor electrode SE1 and/or attenuate electrostatic discharges (ESD).

A third exemplary embodiment of an assembly for operating the radiation-emitting component D is schematically illustrated in FIG. 3. The assembly differs from the first exemplary embodiment merely in the coupling of the individual components. In this exemplary embodiment, the touch sensor S is coupled with the poles Q1, Q2 of the energy source Q via the decoupling unit E. In this exemplary embodiment, the energy source Q can e.g. be a battery, and mains operation as in the embodiments above is also conceivable.

Advantageously, a high-frequency current path between the driver circuit T, the radiation-emitting component D, the touch sensor S and the energy source Q can be interrupted in such a way as to allow a reliable operation of the touch sensor S. The assembly can include the decoupling unit E according to the third exemplary embodiment in addition to the decoupling unit E according to the first exemplary embodiment. It is also conceivable for the assembly to partially include both decoupling units E, e.g. a decoupling element E1 assigned to the first pole Q1 (see FIG. 2) according to the first exemplary embodiment, and a second decoupling element En assigned to the second pole Q2 according to the third exemplary embodiment.

In a first variant, the energy source Q exclusively serves to supply current to the driver circuit T and the touch sensor S via the decoupling unit E. In an alternative variant, further components can be powered through the energy source Q. These components are coupled to the energy source Q via poles Q1, Q2, connected in parallel to the touch sensor S, for example (schematically illustrated with dashed lines). In this case, the decoupling unit E can be arranged downstream and/or upstream of the branching components.

FIG. 4 schematically illustrates a fourth exemplary embodiment of an assembly for operating the radiation-emitting component D. The assembly differs from the first exemplary embodiment merely by the coupling of the individual components. In this exemplary embodiment, the driver circuit T is coupled to the poles Q1, Q2 of the energy source Q via the decoupling unit E.

The assembly can advantageously include the decoupling unit E according to the fourth exemplary embodiment in addition to the decoupling unit E according to one of the preceding exemplary embodiments. Furthermore, it is conceivable that the assembly in each case partially includes the decoupling units E, as in the third exemplary embodiment.

FIG. 5 schematically illustrates a fifth exemplary embodiment of an assembly for operating the radiation-emitting component D. The assembly differs from the preceding embodiments in that the radiation-emitting component D includes a plurality of organic light-emitting diodes D1, D2, D3, with a respective touch of the light-emitting diodes D1, D2, D3 being detected by the touch sensor S and assignable to the respective light-emitting diode D1, D2, D3.

To that end, the organic light-emitting diodes D1, D2, D3 are connected in series and each comprise a first electrode D1E1, D2E1, D3E1 as well as a second electrode D1E2, D2E2, D3E2. This contributes to a cost-efficient production as well as to a high efficiency of the assembly. Light-emitting diodes D1, D2, D3 are self-luminous OLED operating elements in a cockpit, which trigger different actions when touched, but the radiation-emitting operation of which is commonly controlled, e.g. in a day/night mode. To allow a recognition that distinguishes the touch location, the individual light-emitting diodes D1, D2, D3 are decoupled AC-wise not only from the driver circuit T, but also from one another.

The first electrode D1E1 of the first light-emitting diode D1 forms the first electrode DE1 of the radiation-emitting component D. Furthermore, the second electrode D3E2 of the third light-emitting diode D3 forms the second electrode DEn of the radiation-emitting component D. Here, the decoupling unit E, by way of example, couples the radiation-emitting component D to the driver circuit T, as in the first exemplary embodiment. Preferably, the decoupling unit E does not form a common mode choke here, such that also reverse-flowing AC portions are attenuated by the decoupling unit E and a detection of the touch can be assigned to the respective organic light-emitting diode D1, D2, D3. In other exemplary embodiments, the decoupling unit E is arranged and/or designed correspondingly to one of the above exemplary embodiments. In addition, the first electrode D1E1 of the first light-emitting diode D1 and/or the second electrode D3E2 of the third diode D3 each have a further decoupling element (not illustrated) arranged thereon, such that the light-emitting diodes D1, D3 can be discriminated.

The touch sensor S is in each case coupled to one of electrodes D1E1, D1E2, D2E1, D2E2, D3E1, D3E2 of the light-emitting diodes D1, D2, D3. In particular, these electrodes each at least partially form a separate sensor electrode SE1, SE2, SE3 of the touch sensor S. In a first variant, each first electrode D1E1, D2E1, D3E1 forms one of the sensor electrodes SE1, SE2, SE3, for example. In a further variant, each second electrode D1E2, D2E2, D3E2 forms one of the sensor electrodes SE1, SE2, SE3.

The light-emitting diodes D1, D2, D3 following one after the other in the series connection each have a decoupling element DL1, DL2 arranged between them, which decouples AC-wise the respective light-emitting diodes D1, D2, D3 from one another. In particular, coils are concerned here. The decoupling elements DL1, DL2 can be directly integrated as inductances into a respective light-emitting diode D1, D2 or respectively D2, D3 by means of thin film/thick film technology, e.g. on a cap glass, on a substrate next to the light-emitting diode D1, D2, D3, or above an encapsulating layer, or be configured in the form of SMD inductances on a preferably flexible circuit board (so-called FlexPCB), for example in the region of a contact strip.

A respective touch of the light-emitting diodes D1, D2, D3 can be discriminated, as the respective AC detector signal cannot be conducted away from the respective light-emitting diode D1, D2, D3 by the decoupling elements DL1, DL2 as well as E1, En (see FIG. 2), which are adjacent the respective light-emitting diode D1, D2, D3 in a circuitry wise manner, and is therefore essentially only influenced by the touch of the respective light-emitting diode D1, D2, D3. In this exemplary embodiment, the touch sensor S is directly coupled to the poles Q1, Q2 of the energy source Q. In this example, the energy-source Q is in particular a battery.

FIG. 6 schematically shows a sixth exemplary embodiment of an assembly for operating the radiation-emitting component D. The assembly differs from the fifth exemplary embodiment merely in that the touch sensor S merely includes one sensor electrode SE1, wherein a respective touch of the organic light-emitting diodes D1, D2, D3 is detected by the touch sensor S and can be assigned to the respective organic light-emitting diode D1, D2, D3.

In a first variant, one of the electrodes D1E1, D1E2 of the electrode D1 that is first with respect to the series connection at least partially forms the sensor electrode SE1. In another variant, one of the electrodes D2E1, D3E2 of the electrode D3 that is last with respect to the series connection at least partially forms the sensor electrode SE1. Preferably, the decoupling unit E does not form a common mode choke, such that also reverse-flowing AC portions are attenuated by the decoupling unit E and a detection of the touch can be assigned to the respective organic light-emitting diode D1, D2, D3.

The decoupling elements DL1, DL2 are not completely configured to be AC-blocking, but comprise a predetermined high-resistive attenuation to the AC detector signals, so that depending on an amplitude of the detector signal, the touch can be assigned to a respective light-emitting diode D1, D2, D3. As an example, a strongest amplitude is measured if the first electrode D1 is touched, a second-strongest amplitude if the second light-emitting diode D2 is touched, as the detector signal is attenuated by the decoupling element DL1, as well as a third-strongest amplitude if the third light-emitting diode D3 is touched, as the detector signal is attenuated by the decoupling elements DL1 and DL2.

A seventh exemplary embodiment of an assembly for operating the radiation-emitting component D is schematically shown in FIG. 7. The assembly differs from the other exemplary embodiments in that the radiation-emitting component D includes a plurality of separately-operable organic light-emitting diodes D1, D2, D3, with a respective touch of the organic light-emitting diodes D1, D2, D3 being detected by the touch sensor S.

The radiation-emitting component D is a segmented organic light-emitting diode, which can also be referred to as "multi-segment OLED". The individual segments are schematically illustrated as light-emitting diodes D1, D2, D3, which comprise a first electrode D1E1, D2E1, D3E1, respectively, through which a respective separate operation is enabled. One of the first electrodes D1E1, D2E1, D3E1 forms the first electrode DE1 of the radiation-emitting component D.

The light-emitting diodes D1, D2, D3 further comprise second electrodes, which, coupled to one another as a common cathode, form the second electrode DEn of the radiation-emitting component D. It is also conceivable that the second electrodes form a common anode of the radiation-emitting component D.

In a first variant, the first electrode DE1 of the radiation-emitting component D at least partially forms the sensor electrode SE1 of the touch sensor S. By way of example, a touch detection can be performed, whether one of the light-emitting diodes D1, D2, D3 is touched.

In another variant, the second electrode DEn of the radiation-emitting component D forms the sensor electrode SE1 of the touch sensor S. A touch detection can be effected as in the first variant.

In this exemplary embodiment, the decoupling unit E, as an example, decouples the radiation-emitting component D as in the first exemplary embodiment with the driver circuit T. Here, the driver circuit T comprises a separate driver output TA1, TA2, TA3 to each light-emitting diode D1, D2, D3, that has a decoupling element E1, E2, E3 of the decoupling unit E assigned to it. Furthermore, the second common electrode DEn of the radiation-emitting component D is coupled to a driver output TAn of the driver circuit T via a decoupling element En of the decoupling unit E.

In other exemplary embodiments, the decoupling unit E is arranged as in one of the above exemplary embodiments. In this case, a number of decoupling units E1, E2, E3, En of the decoupling unit E can be different from the number illustrated here. In particular, merely the poles Q1, Q2 of the energy source Q (see FIGS. 3 and 4) can in each case have one of the decoupling elements E1, E2, E3, En assigned to it.

An eighth exemplary embodiment of an assembly for operating the radiation-emitting component D is schematically illustrated in FIG. 8. The assembly differs from the seventh exemplary embodiment in that the touch sensor S includes multiple sensor electrodes SE1, SE2, S3, which is at least partially formed by the first electrode of the respective light-emitting diode D1, D2, D3. Advantageously, a respective touch of the light-emitting diodes D1, D2, D3 can be detected by the touch sensor S and be assigned to the respective light-emitting diode D1, D2, D3.

The second electrodes D1E2, D2E2, D3E2 of light-emitting diodes D1, D2, D3 are connected to one another in a DC-wise low-resistive manner, but decoupled from one another in a AC-wise highly-resistive manner. In this context, the radiation-emitting component D comprises decoupling elements DL1, DL2, which are already integrated therein, for example. These decoupling elements DL1, DL2 can be directly mounted in the respective light-emitting diode D1, D2, D3 as inductances by means of thin film/thick film technology, for example on a cover glass (so-called "cap glass", on a substrate next to the light-emitting diode D1, D2, D3 or above an encapsulating layer, or in the form of SMD inductances on a preferably, flexible board (so-called FlexPCB), e.g. in the region of a contact strip.

The second electrodes D1E2, D2E2, D2E3 together form the second electrode DEn of the radiation-emitting component D as in the seventh exemplary embodiment. In a first variant, the second electrode D3E2 of the third light-emitting diode is coupled to the driver output TAn via a decoupling element En. The decoupling element En can directly be integrated in the radiation-emitting component D, or be arranged on the circuit board, which is preferably flexible. In further variants, one of the second electrodes D1E2, D2E2 of the first or second light-emitting diode D1, D2 is coupled to the driver output TAn via the decoupling element En.

In this exemplary embodiment, the decoupling unit E by way of example couples the radiation-emitting component D to the driver circuit T, as in the first exemplary embodiment. In other exemplary embodiments, the decoupling unit E is arranged as in one of the above exemplary embodiments. In this case a number of decoupling elements E1, E2, E3 of the decoupling unit E can be different from the number illustrated here. In particular, merely the poles Q1, Q2 of the energy source Q (see FIG. 3 or 4) can have at least one of the decoupling elements E1, E2, E3 assigned thereto.

A ninth exemplary embodiment of an assembly for operating the radiation-emitting component D is schematically shown in FIG. 9. The assembly differs from the above exemplary embodiments merely in the number of the light-emitting diodes D1, Dn assigned to the radiation-emitting component D. As illustrated in FIG. 9, the radiation-emitting component D can include a plurality of organic light-emitting diodes D1, Dn with first and second electrodes D1E1, D1E2, DnE1, DnE2, wherein in each case one of the electrodes at least partially forms a sensor electrode SE1, SEn of the touch sensor S.

The invention is not limited to the exemplary embodiments by the description of these exemplary embodiments. The invention rather comprises any new feature as well as any combination of features, what particularly includes any combination of features in the claims, even if this feature or this combination is per se not explicitly specified in the patent claims or exemplary embodiments.

LIST OF REFERENCE CHARACTERS

D Radiation-emitting component
DE1, Den Electrodes
D1, D2, D3, Dn Organic light-emitting diodes
D1E1, D2E1, D3E1, DnE1
D1E2, D2E2, D3E2, DnE2 Electrodes
T Driver circuit
T1 Switch
T2 Diode
T3 Shunt resistor
T4 Capacitor
T5 Coil
TA1, TA2, TA3, TAn Driver outputs
E Decoupling unit
E1, E2, E3, En Decoupling elements
EE1, EEn Inputs
EA1, EAn Outputs
S Touch sensor
S1 Capacitor
S2 Resistor
SE1, SE2, SE3, SEn Sensor electrodes
Q Energy source
Q1, Q2 Poles

The invention claimed is:

1. An assembly for operating an organic radiation-emitting component, including:
a driver circuit with at least two driver outputs,
a decoupling unit including at least two inputs, outputs corresponding to the inputs, and a coil, wherein at least one input of the decoupling unit is inductively decoupled AC-wise from the corresponding output of the decoupling unit,
the radiation-emitting component with at least two electrodes and including a plurality of organic light-emitting diodes coupled DC-wise to one another in a series connection, wherein successive organic light-emitting diodes are decoupled AC-wise from one another, and
a touch sensor with a sensor electrode, wherein the sensor electrode is at least partially formed by one of the electrodes of the radiation-emitting component, wherein
the radiation-emitting component emits electromagnetic radiation during operation,
the driver circuit is coupled to each one of the electrodes of the radiation-emitting component through respective ones of the driver outputs in a DC-wise manner,
the driver circuit, separately from the driver outputs, and the touch sensor, separately from the sensor electrode, is coupleable to a common energy source, and
the touch sensor is decoupled from the driver circuit by the decoupling unit in such a way that a touch of the sensor electrode by a user is detectable during operation of the radiation-emitting component.

2. The assembly according to claim 1, wherein
the at least two inputs of the decoupling unit are coupled with the driver outputs of the driver circuit, and the at least two outputs of the decoupling unit are coupled with the electrodes of the radiation-emitting component.

3. The assembly according to claim 1, wherein
the at least two inputs of the decoupling unit are coupleable with poles of the energy source, and the at least two outputs of the decoupling unit are coupled with the touch sensor.

4. The assembly according to claim 1, wherein
the at least two inputs of the decoupling unit are coupleable with poles of the energy source, and the at least two outputs of the decoupling unit are coupled with the driver circuit.

5. The assembly according to claim 1, wherein
the touch sensor is decoupled DC-wise from the respective electrode of the radiation-emitting component.

6. The assembly according to claim 1, wherein
the driver circuit is configured as a switching regulator.

7. The assembly according to claim 1, wherein
the driver circuit is configured as a linear regulator.

8. The assembly according to claim 1, wherein
the radiation-emitting component includes at least one organic light-emitting diode.

9. The assembly according to claim 1, wherein
at least one electrode which is assigned to a first of the plurality of organic light-emitting diodes with respect to the series connection or at least one electrode which is assigned to a last of the plurality of organic light-emitting diodes with respect to the series connection is coupled with the sensor electrode of the touch sensor.

10. The assembly according to claim 1, wherein
the radiation-emitting component includes a plurality of organic light-emitting diodes coupled DC-wise via a common electrode.

11. The assembly according to claim 10, wherein
the organic light-emitting diodes are decoupled AC-wise from one another.

12. The assembly according to claim 1, wherein
the touch sensor comprises a plurality of sensor electrodes, wherein the sensor electrodes are each at least partially formed by one of the electrodes assigned to a respective organic light-emitting diode, wherein
a touch of the respective electrode of the radiation-emitting component by the user is detectable and assignable to the respective organic light-emitting diode.

13. An assembly for operating an organic radiation-emitting component, including:
a driver circuit configured as a buck converter including a first driver output and at least one further driver output, a clocked switch, a diode, a shunt resistor, a capacitor and a coil,
the radiation-emitting component with at least two electrodes and including a plurality of organic light-emitting diodes coupled DC-wise to one another in a series connection, wherein successive organic light-emitting diodes are decoupled AC-wise from one another, and
a decoupling unit including a first input, at least one further input, outputs corresponding to respective ones of the first input and the at least one further input, and at least two decoupling elements, wherein the at least two decoupling elements comprise coils formed as common mode chokes, and the decoupling elements inductively decouple AC-wise, but do not decouple DC-wise, at least one input of the decoupling unit from its corresponding output of the decoupling unit such that the radiation-emitting component is operable with both pulsed and continuous DC current, a capacitive touch sensor with a sensor electrode, wherein the sensor electrode is at least partially formed by one of the electrodes of the radiation-emitting component, wherein the radiation-emitting component emits electromagnetic radiation during operation, the driver circuit is coupled to each one of the electrodes of the radiation-emitting component through respective ones of the driver outputs in a DC-wise manner via respective inputs and outputs of the decoupling unit, the driver circuit, separately from the driver outputs, and the touch sensor, separately from the sensor electrode, is coupleable to a common energy source and is configured to provide a DC current for operating the radiation-emitting components coupled to the driver circuit outputs so that a closed electric circuit is formed such that a flow of DC current is enabled from the first driver output to the further driver output, and the touch sensor is decoupled from the driver circuit by the decoupling unit in such a way that a touch of the sensor electrode by a user is detectable during operation of the radiation-emitting component.

* * * * *